United States Patent [19]

Krone et al.

[11] 4,229,717
[45] Oct. 21, 1980

[54] VOLTAGE CONTROLLED SLOW WAVE TRANSMISSION LINE

[75] Inventors: Kenneth T. Krone, Coral Springs; Quirino Balzano, Plantation, both of Fla.

[73] Assignee: Motorola, Inc., Schaumburg, Ill.

[21] Appl. No.: 944,117

[22] Filed: Sep. 20, 1978

[51] Int. Cl.³ .......................... H01P 1/18; H01P 3/08; H01L 29/92; H01P 1/16
[52] U.S. Cl. .................................... 333/156; 333/161; 333/164; 333/246; 357/14
[58] Field of Search ............... 333/156, 157, 161, 164, 333/246, 247, 236, 238, 239, 202, 209, 139, 140; 332/52; 357/14; 307/320; 330/4.6, 4.9, 53, 56

[56] References Cited

U.S. PATENT DOCUMENTS

| | | | |
|---|---|---|---|
| 3,909,637 | 9/1975 | Dorler | 307/320 |
| 3,911,382 | 10/1975 | Harth et al. | 333/164 X |
| 3,996,536 | 12/1976 | Camisa et al. | 357/14 X |

OTHER PUBLICATIONS

Hasegawa et al., "Properties of Microstrip Line on Si-SiO$_2$ System", in IEEE Trans. on Microwave Theory and Techniques, vol. MTT-19, No. 11, Nov. 1971, pp. 869-881.

*Primary Examiner*—Marvin L. Nussbaum
*Attorney, Agent, or Firm*—Margaret M. Parker; James W. Gillman

[57] ABSTRACT

A slow wave transmission line is compatible for fabrication on a substrate having an epitaxial layer by creating under the transmission line a buried layer, thus allowing voltage control of the electrical length of the line.

3 Claims, 2 Drawing Figures

VOLTAGE CONTROLLED SLOW WAVE TRANSMISSION LINE

BACKGROUND OF THE INVENTION

The present invention relates to the field of transmission lines forming part of a monolithic integrated circuit chip and, more particularly, to such chips having an epitaxial layer formed thereon.

Transmission lines formed by metallized strips deposited on the passivated surface of a substrate are well known, and are used for many purposes beyond mere connection of one point on an IC chip with another point. Such lines may operate in one of three general modes. When the product of the frequency and the resistivity of the substrate is large enough to produce a small dielectric loss angle, the substrate acts as a dielectric, and the line operates in a mode closely resembling the TEM mode, which may be termed the dielectric "quasi-TEM" mode. The dielectric loss in the $SiO_2$ layer can be ignored and almost all of the energy is transmitted through the silicon layer at nearly the velocity of light in a vacuum.

When the product of the frequency and the conductivity (1/R) is large, the substrate appears to be a lossy conductor wall. With a very thin $SiO_2$ layer, the dispersion effect is controlled by skin effect in the substrate and the device operates in a "skin effect" mode.

However, when the frequency is not as high and the resistivity is in the moderate range; e.g., $10^{-4}$ to $10^{+2}$ ohms-cm, the propagation velocity may be slowed down to a few hundredths of the velocity of light in a vacuum. This mode of operation has been termed the "slow wave" mode. A complete description of the theoretical basis of the three modes of operation may be found in "Properties of Microstrip Line on Si-$SiO_2$ System" published in the IEEE "Transactions on Microwave Theory and Techniques", Vol. MTT-19, No. 11, November 1971, pp. 869–881.

The development of the epitaxial process provided many advantages for integrated circuit designs and many monolithic integrated circuits are presently made with an epitaxial layer formed on the substrate. To provide a slow-wave transmission line has heretofore required a Schottky metal which was not compatible with bipolar processes. It is highly desirable to be able to provide a slow wave transmission line by using the normal process steps in epitaxial integrated circuit fabrication.

Another slow wave transmission line, filed as of even date with the present application, and bearing U.S. Ser. No. 944,059, is also compatible with bipolar integrated circuit construction. This other transmission line has no buried layer, but has a p+ diffusion beneath the transmission line. It is, therefore, not voltage controllable as is the present invention, but has better slow wave performance.

SUMMARY OF THE INVENTION

It is therefore an object of the present invention to provide a voltage controllable transmission line on an integrated circuit having an epitaxial layer thereon, for operation in the slow wave mode.

It is a particular object to provide a slow wave line by using only the normal fabrication processes.

These objects and others are provided in accordance with the invention by enhancing the epi-substrate diode capacitance to a value still allowing slow wave operation, but diffusing a low resistivity or "buried" lawyer (n+ in an npn structure) between the epitaxial layer and the substrate in the area underneath the metallized strip of the transmission line. With this type of construction, the line may be made considerably shorter than would be the case without the voltage control.

DETAILED DESCRIPTION OF A PREFERRED EMBODIMENT

Figure 1:
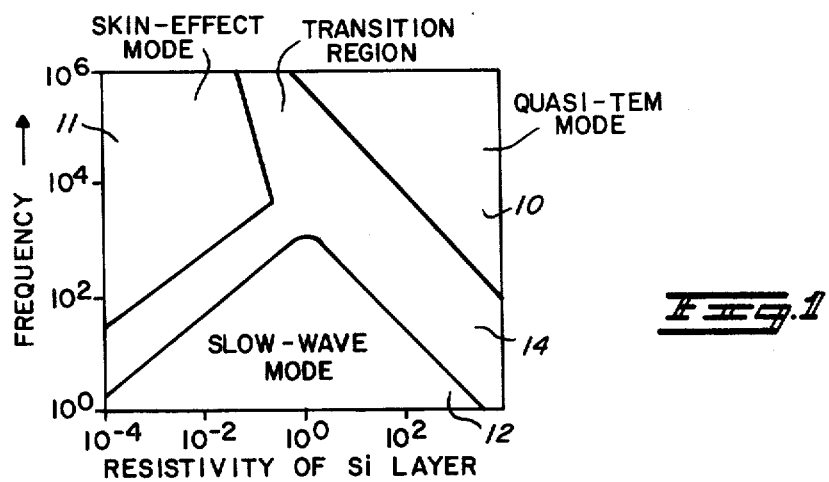
FIG. 1 is a chart of the frequency-resistivity domains of the three operational modes of transmission lines.

The transmission line of the present invention will be best understood with respect to the drawing figures wherein like parts have like reference numerals throughout.

The chart of FIG. 1 displays in general terms the three operational modes of a transmission line. The area 10 is the usual mode of operation, the quasi-TEM mode and results from a high value of the frequency-resistivity product. The area 11 denotes the frequency-resistivity product providing skin effect mode operation. It will be noted that both of the above modes operate at the higher frequency ranges, e.g. upwards of 100 MHz. The area 12 is the area of particular interest in the present invention, and is denoted the "slow wave" mode domain. As will be seen, the slow wave mode is possible at generally lower frequencies than the other two modes and with a moderate range of resistivity of the silicon layer. A transition region 14 is shown separating the practical areas of operation in the three modes.

Figure 2:
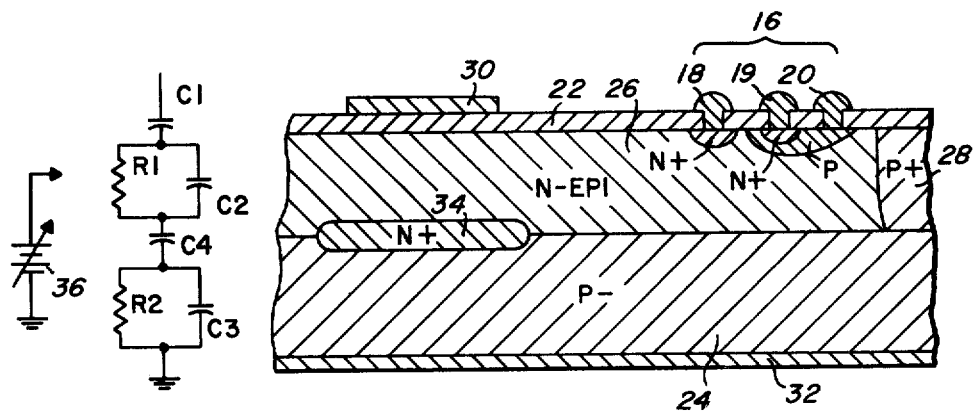
FIG. 2 is a cross-section of the structure of an epitaxial semiconductor device including a transmission line in accordance with the present invention.

In FIG. 2 a preferred embodiment of the invention is shown as part of an epitaxial integrated circuit. For purposes of reference an area designated by the bracket 16 denotes a standard npn transistor with collector contact 18, emitter contact 19 and base contactor 20 shown extending through etched portions in a silicon dioxide or silicon nitride layer 22. As in the usual method of construction, a semiconductor substrate 24 has been provided by slicing a very thin wafer from a single grown crystal of silicon. An n-epitaxial layer 26 has been grown on the upper surface of the substrate 24. The P+ area 28 adjacent the transistor 16 is present for isolation purposes. On the surface of the insulating layer 22, a metallized strip 30 forms a portion of the transmission line of the invention. As is customary, the lower surface of the substrate 24 is also metallized, forming a ground plane 32. Under the transmission strip 30, there is formed a "buried layer" of n+ material 34 by techniques known in the art. Adjacent the cross-section is shown a schematic representation of the equivalent circuit of the transmission line area. A capacitor C1 represents the capacity between the strip 30 and the oxide or nitride layer 22. The epitaxial layer is represented by a capacitor C2 and a small resistance R1, and the substrate layer 24 is represented by capacitor C3 and resistance R2. The capacitor C4 is the capacity across the buried layer substrate interface. Since it will be seen that coupling a voltage source 36 from the epitaxial layer 26 to ground would vary the capacitance of C4, there is provided a means for controlling the capacitance by external means, and likewise the electrical length of the transmission line becomes voltage variable.

The theoretical basis of the slow wave mode of transmission lies in the fact that the velocity of transmission is proportional to $1/\sqrt{lc}$ where $l$ is proportional to $\mu_o d$ and c is proportional to $\epsilon/d$, where d is the distance between the two elements, $\epsilon$ is the dielectric constant of the material between the plates, and $\mu_o$ is a function of the material of the elements. Let $d_1$ represent the thickness of the insulating layer, such as $SiO_2$ and D represent the effective distance between the conductive elements of the transmission line. Then, if the resistance R of the substrate approaches zero, D approaches $d_1$, the inductance of the line decreases, and the velocity of propagation is near the velocity of light in a vacuum. This is the so-called "skin effect" mode.

If R of the substrate approaches infinity, D approaches the actual d, and the capacitance of the line decreases. This is the quasi-TEM mode.

If R of the substrate is not as large, D approaches d for l, but $d_1$ for c. The inductance remains approximately the same, but c increases. The velocity then is $1/\sqrt{\mu_o \epsilon d/d_1}$, which may be as low as a few hundredths (e.g. 0.03) the velocity of light in a vacuum.

Conductors for coupling the transmission line to other circuitry of the integrated circuit are not visible in the cross-section of FIG. 2 but would be constructed as required by the total circuitry. Many of the steps of the diffusion and photolithography processes are omitted in the above description since they are well known in the art. It will also be seen that FIG. 2 has been drawn for maximum clarity and is not to scale.

Thus, there has been provided, in accordance with the invention a means, compatible with epitaxial processes, for providing a slow wave transmission line on an integrated circuit chip, with the capability for voltage control of the line length. Other variations and modifications will be apparent to those skilled in the art and is intended to cover all such as fall within the spirit and scope of the appended claims.

What is claimed is:

1. A slow wave transmission line in an integrated circuit comprising in combination:
   a first layer of semiconductor material of a first type;
   a second layer of semiconductor material of a second type, grown on a first surface of said first semiconductor layer;
   an insulating layer formed on the surface of said second semiconductor layer;
   a metallized strip formed on the surface on said insulating layer;
   a heavily doped buried layer of the second type diffused in an area extending laterally under the area of the metallized strip and between the first and second layers of semiconductor material;
   a metallized layer formed on a second surface of said first semiconductor layer;
   means for providing a biasing control voltage coupled between the second layer of semiconductor material and the metallized layer on the second surface of the first semiconductor material; and
   conductive means coupled to said metallized strip and said metallized layer for making connections thereto.

2. A slow wave transmission line in accordance with claim 1 wherein the means for providing a biasing control voltage includes a variable voltage source.

3. A slow wave transmission line in accordance with claim 1 wherein said first layer is a substrate of p-material, said second layer is an n-epitaxial layer, and said buried layer is an n+ layer.

* * * * *